United States Patent
Ozbas et al.

(10) Patent No.: US 9,621,135 B1
(45) Date of Patent: Apr. 11, 2017

(54) VOLTAGE LEVEL SHIFTER

(71) Applicant: Atmel Corporation, San Jose, CA (US)

(72) Inventors: Murat Ozbas, Rochester, NY (US); Christopher Ludden, Pittsford, CA (US); Imre Knausz, Fairport, NY (US)

(73) Assignee: Atmel Corporation, San Jose, CA (US)

( * ) Notice: Subject to any disclaimer, the term of this patent is extended or adjusted under 35 U.S.C. 154(b) by 0 days.

(21) Appl. No.: 15/089,358

(22) Filed: Apr. 1, 2016

(51) Int. Cl.
*H03L 5/00* (2006.01)
*H03K 3/356* (2006.01)
*G06F 3/041* (2006.01)

(52) U.S. Cl.
CPC ..... *H03K 3/356113* (2013.01); *G06F 3/0416* (2013.01)

(58) Field of Classification Search
CPC ........ H01L 2924/0002; H01L 2924/00; H02M 1/08; H02M 3/1588
See application file for complete search history.

(56) References Cited

U.S. PATENT DOCUMENTS

2015/0062761 A1* 3/2015 Chen ..................... H03K 3/013
361/56

* cited by examiner

*Primary Examiner* — Sibin Chen
(74) *Attorney, Agent, or Firm* — Fish & Richardson P.C.

(57) ABSTRACT

A voltage level shifter including a voltage converting unit to convert an input voltage into a current; a voltage level shifting unit to drive a driving voltage based on the current and shift a voltage level of the driving voltage when a modulation voltage is applied at a first voltage level to a floating ground; a circuit driving voltage supply unit to supply a circuit driving voltage and further to generate a shifted voltage level of the circuit driving voltage when the modulation voltage is applied at the first voltage level; and an output unit to supply an output voltage based on the circuit driving voltage and the driving voltage, and further supply the output voltage at a second voltage level based on the shifted voltage level of the driving voltage and the circuit driving voltage when the modulation voltage is applied at the first voltage level is disclosed.

21 Claims, 4 Drawing Sheets

VOLTAGE LEVEL SHIFTER

TECHNICAL FIELD

This disclosure relates generally to electronics and more particularly to a voltage level shifter for touch systems.

BACKGROUND

A power supply circuit is used to supply power to a device. The power supply circuit may be modulated by a floating voltage source to drive an output voltage. When a high voltage output is required, the maximum modulation range is limited by the breakdown voltages of transistors used in the power circuit. To increase the modulation range, high voltage transistors can be used. However, high voltage transistors will increase the process costs. In addition, when the high voltage transistors are used in the power circuit, the high voltage transistors frequently fail to respond to a low input voltage.

SUMMARY

In general, one innovative aspect of the subject matter described in this specification can be embodied in a voltage level shifter including a voltage converting unit operable to convert an input voltage into a current; a voltage level shifting unit operable to couple to the voltage converting unit and drive a driving voltage that is based on the current from the voltage converting unit, and further operable to couple to a modulated floating ground and shift a voltage level of the driving voltage when a modulation voltage is applied at a first voltage level to the modulated floating ground; a circuit driving voltage supply unit operable to supply a circuit driving voltage and further operable to generate a shifted voltage level of the circuit driving voltage when the modulation voltage is applied at the first voltage level to the circuit driving voltage supply unit; and an output unit operable to couple to the voltage level shifting unit and the circuit driving voltage supply unit and supply an output voltage based on the circuit driving voltage and the driving voltage, and further operable to supply the output voltage at a second voltage level based on the shifted voltage level of the driving voltage and the shifted voltage level of the circuit driving voltage when the modulation voltage is applied at the first voltage level.

The foregoing and other embodiments can each optionally include one or more of the following features, alone or in combination. In particular, one embodiment includes all the following features in combination. The voltage converting unit comprises a passive voltage converting element operable to convert the input voltage into the current. The passive voltage converting element is a capacitor. The voltage level shifting unit comprises a first transistor operable to drive the driving voltage based on the current. The output unit comprises a second transistor operable to drive the circuit driving voltage as the output voltage based on the driving voltage. The modulation voltage is larger than the input voltage. The output voltage is linear to the modulation voltage.

In general, one innovative aspect of the subject matter described in this specification can be embodied in a method performed by a voltage level shifter, the method including converting, by a voltage converting unit, a input voltage into a current; driving, by a voltage level shifting unit, a driving voltage based on the current, the voltage level shifting unit operable to couple to a modulated floating ground; generating, by the voltage level shifting unit, a shifted voltage level of the driving voltage when a modulation voltage is applied at a first voltage level to the modulated floating ground; supplying, by a circuit driving voltage supply unit, a circuit driving voltage, where the modulation voltage is applied to the circuit driving voltage supply unit; generating, by the circuit driving voltage supply unit, a shifted voltage level of the circuit driving voltage when the modulation voltage is applied at the first voltage level to the circuit driving voltage supply unit; and outputting, by an output unit, the shifted voltage level of the circuit driving voltage as an output voltage based on the shifted voltage level of the driving voltage when the modulation voltage is applied at the first voltage level.

The foregoing and other embodiments can each optionally include one or more of the following features, alone or in combination. In particular, one embodiment includes all the following features in combination. The voltage converting unit comprises a passive voltage converting element operable to convert the input voltage into the current. The passive voltage converting element is a capacitor. The voltage level shifting unit comprises a first transistor operable to drive the driving voltage based on the current. The output unit comprises a second transistor operable to drive the circuit driving voltage as the output voltage based on the driving voltage. The modulation voltage is larger than the input voltage. The output voltage is linear to the modulation voltage.

In general, one innovative aspect of the subject matter described in this specification can be embodied in a system including a voltage level shifter; and one or more devices coupled to an output of the voltage level shifter, where the voltage level shifter includes a voltage converting unit operable to convert a first input voltage and a second input voltage into a first current and a second current, voltage level shifting unit operable to couple to the voltage converting unit and drive a first driving voltage and a second driving voltage based on the first current and the second current from the voltage converting unit, and further operable to couple to a modulated floating ground and generate a shifted voltage level of the first driving voltage and a shifted voltage level of the second driving voltage when a modulation voltage is applied at a first voltage level to the modulated floating ground, a circuit driving voltage supply unit operable to supply a circuit driving voltage, and further operable to generate a shifted voltage level of the circuit driving voltage when the modulation voltage is applied at the first voltage level to the circuit driving voltage supply unit, and an output unit operable to couple to the voltage level shifting unit and the circuit driving voltage supply unit and supply an output voltage to the one or more devices based on the circuit driving voltage and the driving voltage, and further operable to, based on the shifted voltage level of the first driving voltage, the shifted voltage level of the second driving voltage, and the shifted voltage level of the circuit driving voltage, supply the output voltage at a second voltage level when the modulation voltage is applied at the first voltage level.

The foregoing and other embodiments can each optionally include one or more of the following features, alone or in combination. In particular, one embodiment includes all the following features in combination. The voltage converting unit comprises a passive voltage converting element operable to convert the input voltage into the current. The passive voltage converting element is a capacitor. The voltage level shifting unit comprises a first transistor operable to drive the driving voltage based on the current. The output unit comprises a second transistor operable to drive the circuit driving voltage as the output voltage based on the driving voltage. The modulation voltage is larger than the input voltage. The output voltage is linear to the modulation voltage.

The details of one or more disclosed implementations are set forth in the accompanying drawings and the description below. Other features, aspects, and advantages will become apparent from the description, the drawings and the claims.

DETAILED DESCRIPTION

In accordance with an embodiment, a voltage level shifter is disclosed, wherein such voltage level shifter may be, for example, a silicon based voltage level shifter. This voltage level shifter circuit may be implemented, for example, to transition input signals to a new potential on the output side of the circuit. Input capacitors convert input voltages into currents and provide the currents to transistors. The input capacitors allow the transistors to respond to low voltage inputs. In addition, the input capacitors provide voltage isolation between the input side and the output side of the level shifter circuit, allowing the ground on the output side of the circuit to be modulated independent of the ground on the input side (e.g., a fixed ground). The modulated ground on the output side of the circuit is limited by the breakdown voltage of the input capacitors rather than the breakdown voltage of the transistors, and therefore permits higher modulation voltage without requiring high voltage transistors. The disclosed example topology can also be used to level-shift from the modulated ground output side to the fixed ground input side. When deployed in a system with mixed voltage domains that are not modulated, the disclosed circuit topology can reduce the overall footprint of the voltage level shifter.

Figure 1:
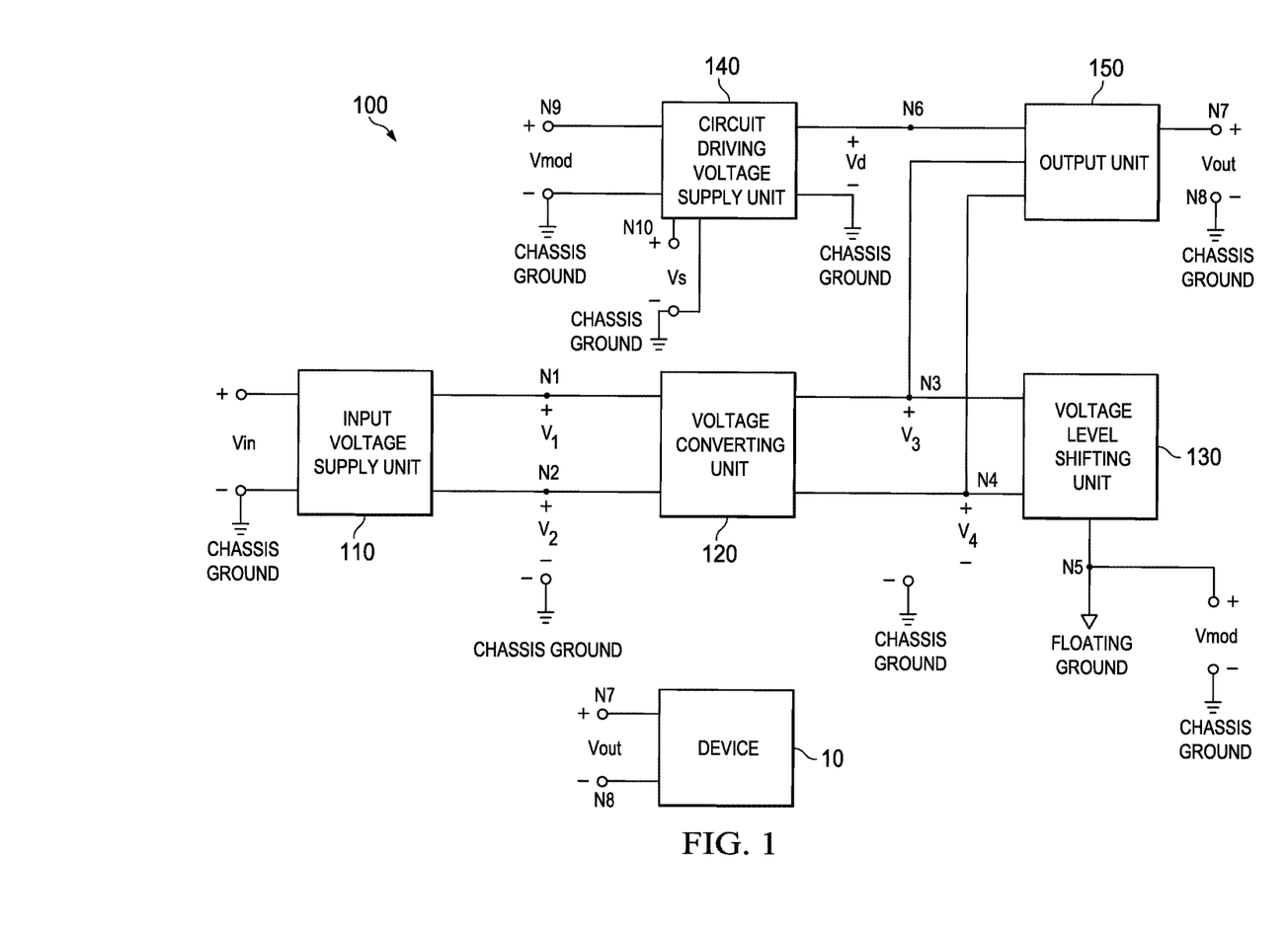
FIG. 1 is a conceptual block diagram of an example of a voltage level shifter, according to an embodiment.

FIG. 1 is a conceptual block diagram of an example voltage level shifter 100, according to an embodiment. One or more devices 10 may be coupled to an output of voltage level shifter 100 at nodes N7, N8. Node N8 is coupled to a chassis ground. A reference voltage can be provided to the chassis ground. All other voltage levels supplied in voltage level shifter 100 can be established in reference to a voltage level of the reference voltage provided to the chassis ground. For example, 0V can be provided to the chassis ground as a reference voltage. In the example embodiment shown, voltage level shifter 100 includes input voltage supply unit 110, voltage converting unit 120, voltage level shifting unit 130, circuit driving voltage supply unit 140, and output unit 150. Voltage level shifter 100 may be implemented in an integrated circuit, e.g., a system-on-chip (SoC), or a combination of integrated circuits and/or discrete components. Voltage level shifter 100 can be included in various electronic systems, including but not limited to: televisions, displays, desktop computers, laptop computers, tablets, and mobile devices such as smartphones, wearable devices, and media devices.

In this example embodiment, input voltage (Vin) is applied to an input of input voltage supply unit 110. The input of input voltage supply unit 110 is coupled to a chassis ground. Input voltage supply unit 110 is configured to convert input voltage (Vin) into first input voltage (V1) and second input voltage (V2). Input voltage supply unit 110 is configured to supply first input voltage (V1) at node N1 and supply second input voltage (V2) at node N2. First input voltage (V1) is a voltage between node N1 and a chassis ground, and second input voltage (V2) is a voltage between node N2 and a chassis ground. For example, when input voltage (Vin) is 1V, input voltage supply unit 110 can be configured to supply 1V as first input voltage (V1) and 0V as second input voltage (V2).

Voltage converting unit 120 is coupled to input voltage supply unit 110. The output of input voltage supply unit 110 is coupled to an input of voltage converting unit 120. First input voltage (V1) and second input voltage (V2) are supplied to the input of voltage converting unit 120. Voltage converting unit 120 is configured to convert first input voltage (V1) into first current (I1) and second input voltage (V2) into second current (I2). Voltage converting unit 120 is configured such that voltage converting unit 120 outputs I1 at node N3 and I2 at node N4.

Further, as shown in the example in FIG. 1, the output of voltage converting unit 120 is coupled to an input of voltage level shifting unit 130. Voltage level shifting unit 130 is configured to generate first driving voltage (V4) and second driving voltage (V3) based on first current (I1) and second current (I2). After voltage level shifting unit 130 generates first driving voltage (V4) and second driving voltage (V3), voltage level shifting unit 130 outputs first driving voltage (V4) at node N4 and second driving voltage (V3) at node N3. Examples of shifting voltage levels by voltage level shifting unit 130 are described in greater detail below with regard to FIG. 3.

Voltage level shifting unit 130 is coupled to a floating ground at node N5. Different levels of voltages can be provided to the floating ground in reference to a voltage level of a reference voltage provided to a chassis ground. For one example, where 0V is provided to the chassis ground as a reference voltage, 1V can be applied to the floating ground. For another example, where 0V is provided to the chassis ground as a reference voltage, 10V can be applied to the floating ground.

Modulation voltage (Vmod) is provided at node N5. Modulation voltage (Vmod) is provided to supply one or more devices 10 with different levels of output voltage (Vout). Modulation voltage (Vmod) can be configured to supply different levels of output voltage (Vout) for one or more devices 10. For example, when 0V of modulation voltage (Vmod) is supplied to voltage level shifter 100, 1V of output voltage (Vout) is configured to be supplied to the device 10. When 10V of modulation voltage (Vmod) is supplied to voltage level shifter 100, 11V of output voltage (Vout) is configured to be supplied to the device 10. Modulation voltage (Vmod) can be applied as a direct current (DC) signal or an alternating current (AC) signal.

As a result of modulation voltage (Vmod) being applied, voltage level shifting unit 130 is thereby configured to shift voltage levels of first driving voltage (V4) and second driving voltage (V3) based on modulation voltage (Vmod). Thus, each voltage at node N3 and node N4 is shifted by modulation voltage (Vmod), and, pursuant to one embodiment, each voltage at node N3 and node N4 is shifted by an amount that is equal, or substantially equal, to modulation voltage (Vmod). For example, where a voltage at node N3 is 1V with respect to ground and a voltage at node N4 is 0V with respect to chassis ground before modulation voltage (Vmod) is applied, the voltage at node N3 is shifted from 1V to 11V with respect to chassis ground and the voltage at node N4 is shifted from 0V to 10V with respect to chassis ground after 10V of modulation voltage (Vmod) is applied. Examples of shifting voltage levels by voltage level shifting unit 130 are described in greater detail with regard to FIG. 3.

Output unit 150 is coupled to voltage level shifting unit 130 and circuit driving voltage supply unit 140. Voltage level shifting unit 130 is configured to provide first driving voltage (V4) and second driving voltage (V3) to an input of output unit 150. Circuit driving voltage supply unit 140 is configured to provide circuit driving voltage (Vd) to output unit 150. Output unit 150 is configured to output circuit driving voltage (Vd) as an output based on first driving voltage (V4) and second driving voltage (V3). Output voltage (Vout) is a voltage between node N7 and a chassis ground.

Circuit driving voltage supply unit 140 is configured to provide circuit driving voltage (Vd) to output unit 150.

Circuit driving voltage supply unit 140 is also configured to change a level of circuit driving voltage (Vd) based on modulation voltage (Vmod). Modulation voltage (Vmod) can be applied at node N9. Modulation voltage (Vmod) can be applied as a DC or AC signal. When modulation voltage (Vmod) is biased at a particular voltage, circuit driving voltage supply unit 140 is configured to provide a first level of circuit driving voltage (Vd) to output unit 150. When modulation voltage (Vmod) is applied to voltage level shifting unit 130 at a different voltage level other than the particular level, circuit driving voltage supply unit 140 is configured to provide a second level of circuit driving voltage (Vd) to output unit 150. In some implementations, the second level of circuit driving voltage (Vd) is set as a sum of the first level of circuit driving voltage (Vd) and modulation voltage (Vmod). For example, when modulation voltage (Vmod) is biased at 0V, circuit driving voltage supply unit 140 is configured to provide 1V of circuit driving voltage (Vd) to output unit 150. When 10V of modulation voltage (Vmod) is applied to voltage level shifting unit 130, circuit driving voltage supply unit 140 is configured to provide 11V of circuit driving voltage (Vd) to output unit 150. Circuit driving voltage supply unit 140 is coupled to a chassis ground.

Driving source voltage (Vs) is applied to circuit driving voltage supply unit 140. In some implementations, circuit driving voltage supply unit 140 can be configured to, based on driving source voltage (Vs), maintain a certain level of voltage when modulation voltage (Vmod) is not applied. In some other implementations, circuit driving voltage supply unit 140 can be configured to, based on driving source voltage (Vs), supply a certain level of voltage to output unit 150 when modulation voltage (Vmod) is applied.

Figure 2:
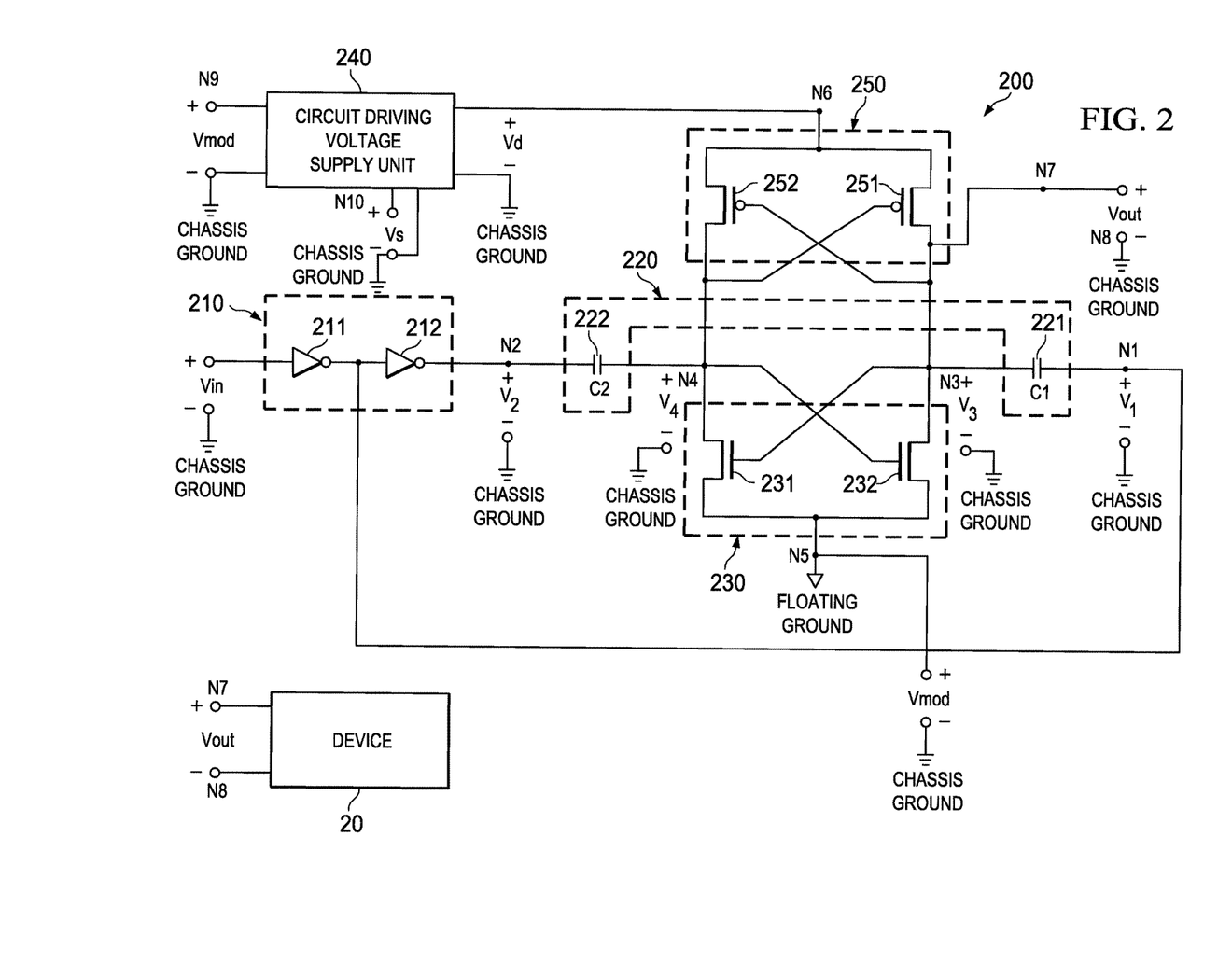
FIG. 2 is a schematic diagram of an example architecture of a voltage level shifter, according to an embodiment.

FIG. 2 is a schematic diagram of an example architecture of a voltage level shifter, according to an embodiment. One or more devices 20 may be coupled to an output of voltage level shifter 200 at nodes N7, N8. Node N8 is coupled to a chassis ground. In the example embodiment shown, voltage level shifter 200 includes input voltage supply unit 210, voltage converting unit 220, voltage level shifting unit 230, circuit driving voltage supply unit 240, and output unit 250. Voltage level shifter 200 may be implemented in an integrated circuit, e.g., a system-on-chip, or a combination of integrated circuits or discrete components. Voltage level shifter 200 can be included in various electronic systems, including but not limited to: televisions, displays, desktop computers, laptop computers, tablets, and mobile devices such as smartphones, wearable devices, and media devices.

In this example embodiment, input voltage (Vin) is applied to an input of input voltage supply unit 210. An input of input voltage supply unit 210 is coupled to a chassis ground. Input voltage supply unit 210 is configured to convert input voltage (Vin) into first input voltage (V1) and second input voltage (V2). Input voltage supply unit 210 includes first inverter 211 and second inverter 212. First inverter 211 is configured to invert input voltage (Vin) and output an inverted signal of input voltage (Vin) as first input voltage (V1) at node N1. Second inverter 212 is configured to invert an output of first inverter 211 and output an inverted signal of the output of first inverter 211 as second input voltage (V2) at node N2. First input voltage (V1) is a voltage between node N1 and a chassis ground, and second input voltage (V2) is a voltage between node N2 and a chassis ground. For example, first inverter 211 is configured to, when input voltage (Vin) is 0.5V, invert input voltage (Vin) to −0.5V, and second inverter 212 is configured to invert −0.5V to 0.5V. Thus, input voltage supply unit 210 is configured to supply 0.5V as first input voltage (V1) and −0.5V as second input voltage (V2). For another example, first inverter 211 is configured to, when input voltage (Vin) is 1V, first inverter 211 is configured to invert input voltage (Vin) to −0V, and second inverter 212 is configured to invert 0V to 1V. Thus, input voltage supply unit 210 is configured to supply 1V as first input voltage (V1) and 0V as second input voltage (V2).

Voltage converting unit 220 is coupled to input voltage supply unit 210. The output of input voltage supply unit 210 is coupled to an input of voltage converting unit 220. First input voltage (V1) and second input voltage (V2) are supplied to the input of voltage converting unit 220. Voltage converting unit 220 is configured to convert first input voltage (V1) into first current (I1) and second input voltage (V2) into second current. Voltage converting unit 220 may include first converting element and second converting element. In some implementations, first converting element can be implemented as first capacitor 221 and second converting element can be implemented as second capacitor 222. First capacitor 221 is configured to convert first input voltage (V1) into first current (I1) and second capacitor 222 is configured to convert second input voltage (V2) into second current (I2). First capacitor 221 is configured to convert first input voltage (V1) into first current (I1) based on capacitance C1 and second capacitor 222 is configured to convert second input voltage (V2) into second current (I2) based on capacitance C2. First capacitor 221 is configured to output first current (I1) at node N3 and second capacitor 222 is configured to output second current (I2) at node N4.

Voltage level shifting unit 230 is coupled to voltage converting unit 220. The output of voltage converting unit 220 is coupled to an input of voltage level shifting unit 230. Voltage level shifting unit 230 is configured to generate first driving voltage (V4) and second driving voltage (V3) based on first current (I1) and second current (I2). Voltage level shifting unit 230 includes first transistor 231 and second transistor 232. First transistor 231 and second transistor 232 can be implemented with a various kinds of transistors including, but not limited to: a bipolar junction transistor, a PMOS transistor, a NMOS transistor, a CMOS transistor, or other types of transistors.

First transistor 231 is configured to generate first driving voltage (V4) at node N4 based on first current (I1). A gate of first transistor 231 is coupled to node N3. A source of first transistor 231 is coupled to node N5 and a drain of first transistor 231 is coupled to node N4. Alternatively, a drain of first transistor 231 can be coupled to node N5 and a source of first transistor 231 can be coupled to node N4. First transistor 231 is configured to be turned on or off based on first current (I1) at node N3. When first transistor 231 is turned on, current flows from node N4 to node N5. Thus, a voltage level at node N4 and a voltage level at node N5 become substantially the same. On the other hand, when first transistor 231 is turned off, current does not flow from node N4 to node N5. Thus, a voltage level at node N4 is maintained as a voltage level corresponding to second current (I2).

Second transistor 232 is configured to generate second driving voltage (V3) at node N3 based on second current (I2). A gate of second transistor 232 is coupled to node N4. A source of second transistor 232 is coupled to node N5 and a drain of second transistor 232 is coupled to node N3. Alternatively, a drain of second transistor 232 can be coupled to node N5 and a source of second transistor 232 can be coupled to node N3. Second transistor 232 is configured to be turned on or off based on second current (I2) at node N4. When second transistor 232 is turned on, current flows from node N3 to node N5. Thus, a voltage level at node N3 and a voltage level at node N5 becomes substantially the same. On the other hand, when second transistor 232 is turned off, current does not flow from node N3 to node N5. Thus, a voltage level at node N3 is maintained at a voltage level corresponding to first current (I1).

Voltage level shifting unit 230 is coupled to a floating ground at node N5. Modulation voltage (Vmod) is applied at node N5. As modulation voltage (Vmod) is applied, voltage level shifting unit 230 is configured to shift voltage levels of first driving voltage (V4) and second driving voltage (V3) based on modulation voltage (Vmod). Thus, each voltage at node N3 and at node N4 is shifted by modulation voltage (Vmod). For example, where a voltage at node N3 is 1V and a voltage at node N4 is 0V before modulation voltage (Vmod) is applied, the voltage at node N3 is shifted from 1V to 11V and the voltage at node N4 is shifted from 0V to 10V after 10V of modulation voltage (Vmod) is applied. Examples of shifting voltage levels by voltage level shifting unit 230 are described in greater detail with regard to FIG. 3.

Output unit 250 is coupled to voltage level shifting unit 230 and circuit driving voltage supply unit 240. Voltage level shifting unit 230 is configured to provide first driving voltage (V4) and second driving voltage (V3) to an input of output unit 250. Based on first driving voltage (V4) and second driving voltage (V3), output unit 250 is configured to output circuit driving voltage (Vd) as output voltage (Vout). Output unit 250 includes third transistor 251 and fourth transistor 252. third transistor 251 and fourth transistor 252 can be implemented with a various kinds of transistors including, but not limited to: a bipolar junction transistor, a p-type metal-oxide-semiconductor (PMOS) transistor, a n-type metal-oxide-semiconductor (NMOS) transistor, a complementary metal-oxide-semiconductor (CMOS) transistor, or other types of transistors.

Third transistor 251 is configured to output circuit driving voltage (Vd) as output voltage (Vout) based on first driving voltage (V4) at node N4. A gate of third transistor 251 is coupled to node N4. A source of third transistor 251 is coupled to node N6 and a drain of third transistor 251 is coupled to node N7. Alternatively, a drain of third transistor 251 can be coupled to node N3 and a source of third transistor 251 can be coupled to node N6. Third transistor 251 is configured to be turned on or off based on a first driving voltage (V4). When third transistor 251 is turned on based on first driving voltage (V4), current flows from node N6 to node N7, circuit driving voltage (Vd) provided by circuit driving voltage supply unit 240 is supplied to node N7, and output unit 250 outputs circuit driving voltage (Vd) as output voltage (Vout). On the other hand, when third transistor 251 is turned off based on first driving voltage (V4), current does not flow from node N6 to node N, and output unit 250 outputs circuit driving voltage (Vd) as output voltage (Vout).

Fourth transistor 252 is configured to output circuit driving voltage (Vd) as output voltage (Vout) based on second driving voltage (V3) at node N3. A gate of fourth transistor 252 is coupled to node N3. A source of fourth transistor 252 is coupled to node N6 and a drain of fourth transistor 252 is coupled to node N4. Alternatively, a drain of fourth transistor 252 can be coupled to node N4 and a source of fourth transistor 252 can be coupled to node N6. Fourth transistor 252 is configured to be turned on or off based on a second driving voltage (V3). When fourth transistor 252 is turned on based on second driving voltage (V3), current flows from node N6 to node N4. Circuit driving voltage (Vd) provided by circuit driving voltage supply unit 240 is supplied to node N4. On the other hand, when fourth transistor 252 is turned off based on second driving voltage (V3), current does not flow from node N6 to node N4.

Circuit driving voltage supply unit 240 is configured to provide circuit driving voltage (Vd) to output unit 250. Third transistor 251 and fourth transistor 252 are configured to output circuit driving voltage (Vd) as an output based on first driving voltage (V4) and second driving voltage (V3). Output voltage (Vout) is a voltage between node N7 and a chassis ground.

Circuit driving voltage supply unit 240 is configured to change a level of circuit driving voltage (Vd) based on modulation voltage (Vmod). When modulation voltage (Vmod) is biased at a particular level and is applied to voltage level shifting unit 230, circuit driving voltage supply unit 240 is configured to provide a first level of circuit driving voltage (Vd) to output unit 250. As modulation voltage (Vmod) is applied to voltage level shifting unit 230 at a different voltage level other than the particular level, circuit driving voltage supply unit 240 is configured to provide a second level of circuit driving voltage (Vd) to output unit 250. In some implementations, the second level of circuit driving voltage (Vd) can be set as a sum of the first level of circuit driving voltage (Vd) and modulation voltage (Vmod). For example, when modulation voltage (Vmod) is biased at 0V and 0V of modulation voltage (Vmod) is applied to voltage level shifting unit 230, circuit driving voltage supply unit 240 is configured to provide 1V of circuit driving voltage (Vd) to output unit 250. When 10V of modulation voltage (Vmod) is applied to voltage level shifting unit 230, circuit driving voltage supply unit 240 can be configured to provide 11V of circuit driving voltage (Vd) to output unit 250. Circuit driving voltage supply unit 240 is coupled to a chassis ground.

Driving source voltage (Vs) is applied to circuit driving voltage supply unit circuit driving voltage supply unit 240 via node N10. In some implementations, circuit driving voltage supply unit 240 can be configured to, based on driving source voltage (Vs), maintain a certain level of voltage when modulation voltage (Vmod) is not applied. In some other implementations, circuit driving voltage supply unit 240 can be configured to, based on driving source voltage (Vs), supply a certain level of voltage to output unit 250 when modulation voltage (Vmod) is applied.

Figure 3:
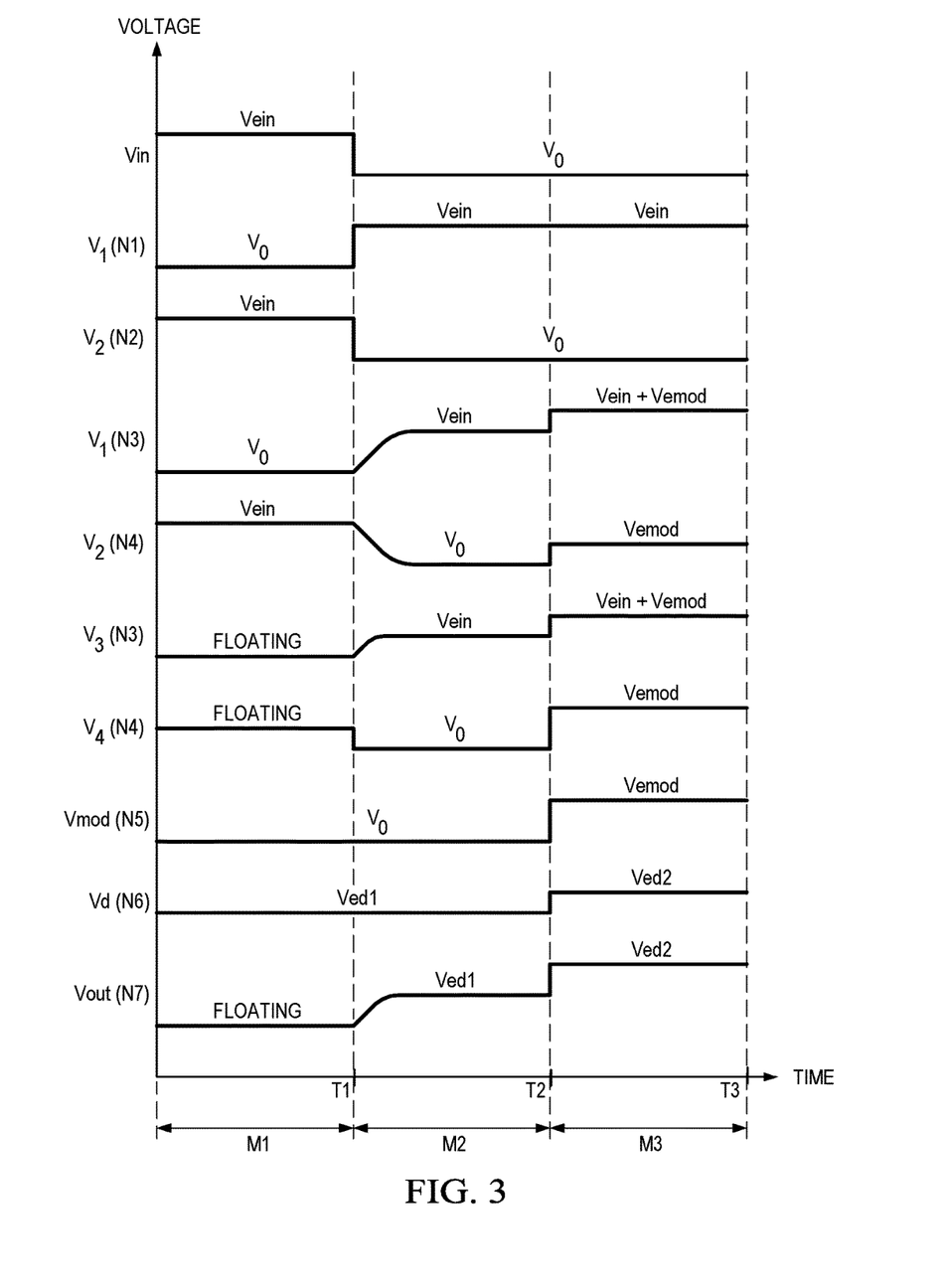
FIG. 3 is a diagram of example voltage changes at different nodes of a voltage level shifter, according to an embodiment.

FIG. 3 is a diagram of example voltage level changes at different nodes of a voltage level shifter, according to an embodiment. In this example embodiment, voltage level shifter 200 is configured to operate in three modes. In first mode M1, first level (Vein) of input voltage (Vin) and fifth level (Ved1) of circuit driving voltage (Vd) are supplied to voltage level shifter 200. Modulation voltage (Vmod) is biased at a particular level and is supplied to voltage level shifter 200. For example, modulation voltage (Vmod) is biased at second level (V0). In second mode M2, second level (V0) of input voltage (Vin) and fifth level (Ved1) of circuit driving voltage (Vd) are supplied to voltage level shifter 200. Modulation voltage (Vmod) is biased at a particular level and is supplied to voltage level shifter 200. For example, modulation voltage (Vmod) is biased at second level (V0). In third mode M3, second level (V0) of input voltage (Vin), third level (Vemod) of modulation voltage (Vmod), and sixth level (Ved2) of circuit driving voltage (Vd) are supplied to voltage level shifter 200.

Example First Mode Operations

In first mode M1, first level (Vein) of input voltage (Vin) is applied to an input of input voltage supply unit 210. First inverter 211 is configured to invert input voltage (Vin) and output an inverted signal of input voltage (Vin) as first input voltage (V1) at node N1. First inverter 211 is configured to invert first level (Vein) of input voltage (Vin) and output second level (V0) of a voltage as first input voltage (V1) at node N1. Second inverter 212 is configured to invert an output of first inverter 211. Second inverter 212 is configured to invert second level (V0) of a voltage at node N1 and output first level (Vein) of a voltage at node N2. For example, first level (Vein) can be set as 1V and second level (V0) can be set as 0V. Then, a voltage level at node N1 is 0V and a voltage level at node N2 is 1V.

Voltage converting unit 220 is coupled to input voltage supply unit 210. The output of input voltage supply unit 210 is coupled to an input of voltage converting unit 220. First input voltage (V1) and second input voltage (V2) are supplied to the input of voltage converting unit 220. Second level (V0) of first input voltage (V1) and first level (Vein) of second input voltage (V2) are supplied to voltage converting unit 220. For example, first capacitor 221 is configured to convert first input voltage (V1) into first current (I1) based on capacitance C1. Second capacitor 222 is configured to convert second input voltage (V2) into second current (I2) based on capacitance C2. As first capacitor 221 and second capacitor 222 complete converting, first capacitor 221 is configured to output first current (I1) at node N3 and second capacitor 222 is configured to output second current (I2) at node N4.

Voltage level shifting unit 230 is coupled to voltage converting unit 220. The output of voltage converting unit 220 is coupled to an input of voltage level shifting unit 230. Voltage level shifting unit 230 is configured to generate first driving voltage (V4) and second driving voltage (V3) based on first current (I1) and second current (I2). First current (I1) is applied to a gate of first transistor 231 and second current (I2) is applied to a gate of second transistor 232.

In some implementations, while second level (V0) of first input voltage (V1) is supplied to voltage converting unit 220, first current (I1) is configured to turn off first transistor 231. In some other implementations, while second level (V0) of first input voltage (V1) is supplied to voltage converting unit 220, node N3 is configured to be biased to maintain second level (V0) of a voltage.

In some implementations, while first level (Vein) second input voltage (V2) is supplied to voltage converting unit 220, second current (I2) is configured to turn off second transistor 232. In some other implementations, while first level (Vein) second input voltage (V2) is supplied to voltage converting unit 220, node N4 is configured to be biased to maintain second level (V0) of a voltage.

Voltage level shifting unit 230 is coupled to a floating ground at node N5. Modulation voltage (Vmod) can be applied at node N5. In first mode M1, modulation voltage (Vmod) is biased at a particular level and is applied to voltage level shifting unit 230. For example, modulation voltage (Vmod) is configured to be biased at second level (V0).

Output unit 250 is coupled to voltage level shifting unit 230. Voltage level shifting unit 230 is configured to provide first driving voltage (V4) and second driving voltage (V3) to an input of output unit 250. Based on first driving voltage (V4) and second driving voltage (V3), output unit 250 is configured to output circuit driving voltage (Vd) as output voltage (Vout). In some implementations, first level (Vein) of first driving voltage (V4) is applied to a gate of third transistor 251 and second level (V0) of second driving voltage (V3) is applied to a gate of fourth transistor 252.

Circuit driving voltage supply unit 240 is configured to provide circuit driving voltage (Vd) to output unit 250. Third transistor 251 and fourth transistor 252 are configured to output circuit driving voltage (Vd) as output voltage (Vout) based on first driving voltage (V4) and second driving voltage (V3). In some implementations, when third transistor 251 is turned on and fourth transistor 252 is turned off, output unit 250 is configured to output circuit driving voltage (Vd) as output voltage (Vout). When third transistor 251 is turned off and fourth transistor 252 is turned on, output unit 250 is configured not to output circuit driving voltage (Vd) as output voltage (Vout). In some implementations, when third transistor 251 is turned off and fourth transistor 252 is turned on, output unit 250 is configured to output circuit driving voltage (Vd) as output voltage (Vout). When third transistor 251 is turned on and fourth transistor 252 is turned off, output unit 250 is configured not to output circuit driving voltage (Vd) as output voltage (Vout).

Example Second Mode of Operation

Referring to FIG. 3, in second mode M2, second level (V0) of input voltage (Vin) is applied to an input of input voltage supply unit 210. First inverter 211 is configured to invert input voltage (Vin) and output an inverted signal of input voltage (Vin) as first input voltage (V1) at node N1. First inverter 211 is configured to invert second level (V0) of a voltage and output first level (Vein) of a voltage as first input voltage (V1) at node N1. Second inverter 212 is configured to invert an output of first inverter 211. Second inverter 212 is configured to invert first level (Vein) of a voltage at node N1 and output second level (V0) of a voltage at node N2. For example, first level (Vein) can be set as 1V and second level (V0) can be set as 0V. Then, a voltage level at node N1 is 1V and a voltage level at node N2 is 0V.

In some implementations, in second mode M2, input voltage (Vin) is configured to be applied to input voltage supply unit 210 at first level (Vein). First inverter 211 is configured to invert input voltage (Vin) and output an inverted signal of input voltage (Vin) as first input voltage (V1) at node N1. First inverter 211 is configured to invert first level (Vein) of a voltage and output second level (V0) of a voltage as first input voltage (V1) at node N1. Second inverter 212 is configured to invert an output of first inverter 211. Second inverter 212 is configured to invert second level (V0) of a voltage at node N1 and output first level (Vein) of a voltage at node N2. For example, first level (Vein) can be set as 1V and second level (V0) can be set as 0V. Then, a voltage level at node N1 is 0V and a voltage level at node N2 is 1V.

Referring back to FIG. 3, voltage converting unit 220 is coupled to input voltage supply unit 210. The output of input voltage supply unit 210 is coupled to an input of voltage converting unit 220. First input voltage (V1) and second input voltage (V2) are supplied to the input of voltage converting unit 220. First level (Vein) of first input voltage (V1) and second level (V0) of second input voltage (V2) are supplied to voltage converting unit 220. For example, first capacitor 221 is configured to convert first input voltage (V1) into first current (I1) based on capacitance C1. Second capacitor 222 is configured to convert second input voltage (V2) based on capacitance C2. As first capacitor 221 and second capacitor 222 complete converting first input voltage (V1) and second input voltage (V2) into first current (I1) and second current (I2), first capacitor 221 is configured to output first current (I1) corresponding to first level (Vein) of a voltage at node N3 and second capacitor 222 is configured to output second current (I2) corresponding to second level (V0) of a voltage at node N4. For example, where first level (Vein) is set as 1V and second level (V0) is set as 0V, first capacitor 221 is configured to output first current (I1) corresponding to 1V at node N3 and second capacitor 222 is configured to output second current (I2) corresponding to 0V at node N4.

Voltage level shifting unit 230 is coupled to voltage converting unit 220. The output of voltage converting unit 220 is coupled to an input of voltage level shifting unit 230. First current (I1) from node N3 and second current (I2) from node N4 are inputs to voltage level shifting unit 230. Voltage level shifting unit 230 is configured to generate first driving voltage (V4) and second driving voltage (V3) based on first current (I1) and second current (I2). First current (I1) is applied to a gate of first transistor 231 and second current (I2) is applied to a gate of second transistor 232.

When first current (I1) corresponding to first level (Vein) of first input voltage (V1) is applied to a gate of first transistor 231, first transistor 231 is configured to be turned on. A voltage level at node N4 and a voltage level at node N5 becomes substantially the same and current flows from node N4 to node N5. In some implementations, node N5 is configured to be biased to maintain second level (V0). Since a voltage level at node N4 and a voltage level at node N5 are substantially the same, node N4 is configured to maintain substantially same as second level (V0).

When second current (I2) corresponding to second level (V0) of second input voltage (V2) is applied to a gate of second transistor 232, second transistor 232 is configured to be turned off. A voltage level at node N3 maintains a particular level and current does not flow from node N3 to node N5. Since first capacitor 221 is configured to maintain first level (Vein) at node N3, voltage level shifting unit 230 is configured to output first level (Vein) as second driving voltage (V3).

Voltage level shifting unit 230 is coupled to a floating ground at node N5. Modulation voltage (Vmod) can be applied at node N5. In second mode M2, modulation voltage (Vmod) is biased at a particular level and is applied to voltage level shifting unit 230. For example, when second level (V0) of modulation voltage (Vmod) is applied to voltage level shifting unit 230, voltage level shifting unit 230 is configured not to shift voltage levels of first driving voltage (V4) and second driving voltage (V3).

Output unit 250 is coupled to voltage level shifting unit 230. Voltage level shifting unit 230 is configured to provide first driving voltage (V4) and second driving voltage (V3) to an input of output unit 250. Based on first driving voltage (V4) and second driving voltage (V3), output unit 250 is configured to output circuit driving voltage (Vd) as output voltage (Vout). In this embodiment, second level (V0) of first driving voltage (V4) is applied to a gate of third transistor 251 and first level (Vein) of second driving voltage (V3) is applied to a gate of fourth transistor 252.

Circuit driving voltage supply unit 240 is configured to provide circuit driving voltage (Vd) to output unit 250. Third transistor 251 and fourth transistor 252 are configured to output circuit driving voltage (Vd) as output voltage (Vout) based on first driving voltage (V4) and second driving voltage (V3). In some implementations, when third transistor 251 is turned on and fourth transistor 252 is turned off, output unit 250 is configured to output circuit driving voltage (Vd) as output voltage (Vout). When third transistor 251 is turned off and fourth transistor 252 is turned on, output unit 250 is configured not to output circuit driving voltage (Vd) as output voltage (Vout). In some implementations, when third transistor 251 is turned off and fourth transistor 252 is turned on, output unit 250 is configured to output circuit driving voltage (Vd) as output voltage (Vout). When third transistor 251 is turned on and fourth transistor 252 is turned off, output unit 250 is configured not to output circuit driving voltage (Vd) as output voltage (Vout).

When first level (Vein) of second driving voltage (V3) is applied to a gate of fourth transistor 252, fourth transistor 252 is configured to be turned off. On the other hand, when second level (V0) of first driving voltage (V4) is applied to a gate of third transistor 251, third transistor 251 is configured to be turned on. A voltage level at node N6 and a voltage level at node N7 becomes substantially the same and current flows from node N6 to node N7. In second mode M2, circuit driving voltage supply unit 240 is configured to provide fifth level (Ved1) of circuit driving voltage (Vd) at node N6. Thus, third transistor 251 is configured to drive node N7 at fifth level (Ved1) and output unit 250 is configured to output fifth level (Ved1) of circuit driving voltage (Vd) as output voltage (Vout). In some implementations, fifth level (Ved1) is set same as first level (Vein).

Example Third Mode of Operation

In third mode M3, second level (V0) of input voltage (Vin) is applied to an input of input voltage supply unit 210. First inverter 211 is configured to invert input voltage (Vin) and output an inverted signal of input voltage (Vin) as first input voltage (V1) at node N1. First inverter 211 is configured to invert second level (V0) of a voltage and output first level (Vein) of a voltage as first input voltage (V1) at node N1. Second inverter 212 is configured to invert an output of first inverter 211. Second inverter 212 is configured to invert first level (Vein) of a voltage at node N1 and output second level (V0) of a voltage at node N2. For example, first level (Vein) can be set as 1V and second level (V0) can be set as 0V. Then, a voltage level at node N1 is 1V and a voltage level at node N2 is 0V.

Voltage converting unit 220 is coupled to input voltage supply unit 210. The output of input voltage supply unit 210 is coupled to an input of voltage converting unit 220. First input voltage (V1) and second input voltage (V2) are supplied to the input of voltage converting unit 220. First level (Vein) of first input voltage (V1) and second level (V0) of second input voltage (V2) are supplied to voltage converting unit 220. For example, first capacitor 221 is configured to convert first input voltage (V1) into first current (I1) based on capacitance C1. Second capacitor 222 is configured to convert second input voltage (V2) into second current (I2) based on capacitance C2. As first capacitor 221 and second capacitor 222 complete converting, first capacitor 221 is configured to output first current (I1) at node N3 and second capacitor 222 is configured to output second current (I2) at node N4.

Voltage level shifting unit 230 is coupled to voltage converting unit 220. The output of voltage converting unit 220 is coupled to an input of voltage level shifting unit 230. First current (I1) corresponding to first level (Vein) of first input voltage (V1) at node N3 and second current (I2) corresponding to second level (V0) of second input voltage (V2) at node N4 are inputs to voltage level shifting unit 230. Voltage level shifting unit 230 is configured to generate first driving voltage (V4) and second driving voltage (V3) based on first current (I1) and second current (I2). First current (I1) is applied to a gate of first transistor 231 and second current (I2) is applied to a gate of second transistor 232.

In third mode M3, modulation voltage (Vmod) is applied to voltage level shifting unit 230. As modulation voltage (Vmod) is applied, voltage level shifting unit 230 is configured to shift voltage levels of first driving voltage (V4) and second driving voltage (V3) based on modulation voltage (Vmod). When a particular level of modulation voltage (Vmod) is applied at node N5, a voltage level of first driving voltage (V4) and a voltage level of second driving voltage (V3) shifts based on the particular level of modulation voltage (Vmod).

When first current (I1) corresponding to first level (Vein) of first input voltage (V1) is applied to a gate of first transistor 231, first transistor 231 is configured to be turned on. A voltage level at node N4 and a voltage level at node N5 becomes substantially the same and current flows from node N4 to node N5. Since third level (Vemod) of modulation voltage (Vmod) is applied at node N5 in third mode M3, a voltage level at node N4 and node N5 is maintained as third level (Vemod). Voltage level shifting unit 230 is configured to output third level (Vemod) as first driving voltage (V4). For example, where second level (V0) is set as 0V, first level (Vein) is set as 1V, and third level (Vemod) is set as 10V, voltage level shifting unit 230 is configured to output 10V as first driving voltage (V4). Voltage level shifting unit 230 is configured to shift a voltage level at node N4 from 0V to 10V.

When second current (I2) corresponding to second level (V0) second input voltage (V2) is applied to a gate of second transistor 232, second transistor 232 is configured to be turned off. Since third level (Vemod) of modulation voltage (Vmod) is applied to node N5, a voltage level at node N3 is configured to be shifted by modulation voltage (Vmod). A voltage level at node N3 is shifted from first level (Vein) to fourth level (Vein+Vemod). Voltage level shifting unit 230 is configured to output fourth level (Vein+Vemod) as second driving voltage (V3).

Circuit driving voltage supply unit 240 is configured to provide circuit driving voltage (Vd) to output unit 250. Circuit driving voltage supply unit 240 is configured to change a level of circuit driving voltage (Vd) based on modulation voltage (Vmod). When third level (Vemod) of modulation voltage (Vmod) is applied to voltage level shifting unit 230, circuit driving voltage supply unit 240 is configured to provide a sixth level (Ved2) of circuit driving voltage (Vd) to output unit 250. For example, when modulation voltage (Vmod) is biased at second level (V0), circuit driving voltage supply unit 240 is configured to provide 1V of circuit driving voltage (Vd) to output unit 250. In this example, when by of modulation voltage (Vmod) is applied to voltage level shifting unit 230, circuit driving voltage supply unit 240 can be configured to provide 11V of circuit driving voltage (Vd) to output unit 250.

Output unit 250 is coupled to voltage level shifting unit 230. Voltage level shifting unit 230 is configured to provide first driving voltage (V4) and second driving voltage (V3) to an input of output unit 250. Based on first driving voltage (V4) and second driving voltage (V3), output unit 250 is configured to output circuit driving voltage (Vd) as output voltage (Vout). In this embodiment, third level (Vemod) of first driving voltage (V4) is applied to a gate of third transistor 251 and fourth level (Vein+Vemod) of second driving voltage (V3) is applied to a gate of fourth transistor 252.

When fourth level (Vein+Vemod) of second driving voltage (V3) is applied to a gate of fourth transistor 252, fourth transistor 252 is configured to be turned off. On the other hand, when third level (Vemod) of first driving voltage (V4) is applied to a gate of third transistor 251, third transistor 251 is configured to be turned on. A voltage level at node N6 and a voltage level at node N7 becomes substantially the same and current flows from node N6 to node N7. In third mode M3, circuit driving voltage supply unit 240 is configured to provide sixth level (Ved2) of circuit driving voltage (Vd) at node N6. Thus, third transistor 251 is configured to drive node N7 at sixth level (Ved2) of a voltage and output unit 250 is configured to output sixth level (Ved2) of circuit driving voltage (Vd) as output voltage (Vout). In some implementations, sixth level (Ved2) is set as a sum of first level (Vein) and third level (Vemod).

Figure 4:
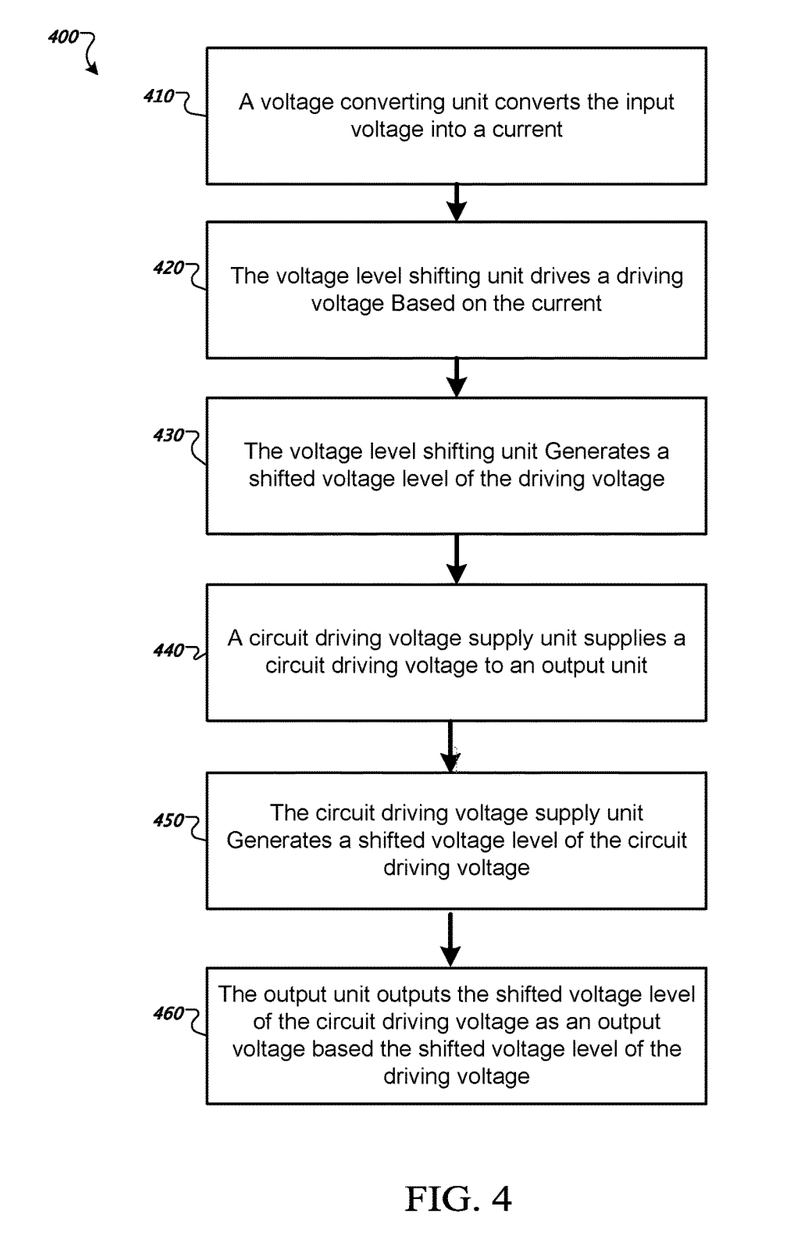
FIG. 4 is a flow diagram of an example process performed by a voltage level shifter.

FIG. 4 is a flow diagram of an example process performed by a voltage level shifter, such as the voltage level shifter described in reference to FIGS. 1-3. The voltage level shifter is configured to supply the output voltage to other circuits. In some implementations, the circuits are configured to be in the same system. For example, the voltage level shifter can supply the output voltage to a touch sensing circuit in a touch pad system.

A voltage converting unit converts the input voltage into a current (Step 410). The voltage converting unit converts voltages provided by the input voltage supply unit into currents. As the voltage converting unit completes converting, the voltage converting unit outputs the current. The voltage converting unit provides the current a voltage level shifting unit.

The voltage level shifting unit drives a driving voltage based on the current (Step 420). The voltage level shifting unit includes voltage converting elements. In some implementations, these voltage elements can be transistors. The transistors are operated, based on the current, to generate the driving voltage. The voltage level shifting unit is coupled to a floating ground and a modulation voltage is applied to the floating ground to provide the modulation voltage to the voltage level shifting unit.

The voltage level shifting unit generates a shifted voltage level of the driving voltage when the modulation voltage is applied at a first voltage level to the modulated floating ground (Step 430). When the modulation voltage is provided to the voltage level shifting unit, the voltage level shifting unit shifts the voltage level of the driving voltage based on the modulation voltage.

A circuit driving voltage supply unit supplies a circuit driving voltage to an output unit (Step 440). The circuit driving voltage supply unit is coupled to the modulated floating ground.

The circuit driving voltage supply unit generates a shifted voltage level of the circuit driving voltage when the modulation voltage is applied at the first voltage level to the modulation floating ground (Step 450). The circuit driving voltage supply unit can change the voltage level of the circuit driving voltage based on a voltage level of the modulation voltage. For example, when the modulation voltage is biased at a particular level and is applied to the voltage level shifting unit, the circuit driving voltage supply unit provides a first level of the circuit driving voltage to the output unit. As the modulation voltage is applied to the voltage level shifting unit, the circuit driving voltage supply unit provides a second level of the circuit driving voltage to the output unit. In some implementations, the second level of the circuit driving voltage is set as a sum of the first level of circuit driving voltage and the modulation voltage. In some implementations, a voltage level of the modulation voltage is higher than a voltage level of the input voltage.

The output unit outputs the shifted voltage level of the circuit driving voltage as an output voltage based on the shifted voltage level of the driving voltage when the modulation voltage is applied at the first voltage level to the circuit driving voltage supply unit (Step 460). The output unit includes transistors. The transistors are operated, based on the driving voltage, to output the circuit driving voltage as an output voltage. The output voltage can be provided to one or more devices coupled to the output unit.

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination.

What is claimed is:

1. A voltage level shifter comprising:
   a voltage converting unit operable to convert an input voltage into a current;
   a voltage level shifting unit operable to couple to the voltage converting unit and drive a driving voltage that is based on the current from the voltage converting unit, and further operable to couple to a modulated floating ground and shift a voltage level of the driving voltage when a modulation voltage is applied at a first voltage level to the modulated floating ground;
   a circuit driving voltage supply unit operable to supply a circuit driving voltage and further operable to generate a shifted voltage level of the circuit driving voltage when the modulation voltage is applied at the first voltage level to the circuit driving voltage supply unit; and
   an output unit operable to couple to the voltage level shifting unit and the circuit driving voltage supply unit and supply an output voltage based on the circuit driving voltage and the driving voltage, and further operable to supply the output voltage at a second voltage level based on the shifted voltage level of the driving voltage and the shifted voltage level of the circuit driving voltage when the modulation voltage is applied at the first voltage level.

2. The voltage level shifter of claim 1, where the voltage converting unit comprises a passive voltage converting element operable to convert the input voltage into the current.

3. The voltage level shifter of claim 2, where the passive voltage converting element is a capacitor.

4. The voltage level shifter of claim 1, where the voltage level shifting unit comprises a first transistor operable to drive the driving voltage based on the current.

5. The voltage lever shifter of claim 1, where the output unit comprises a second transistor operable to drive the circuit driving voltage as the output voltage based on the driving voltage.

6. The voltage level shifter of claim 1, where the modulation voltage is larger than the input voltage.

7. The voltage level shifter of claim 1, where the output voltage is linear to the modulation voltage.

8. A method performed by a voltage level shifter, the method comprising:
   converting, by a voltage converting unit, a input voltage into a current;
   driving, by a voltage level shifting unit, a driving voltage based on the current, the voltage level shifting unit operable to couple to a modulated floating ground;
   generating, by the voltage level shifting unit, a shifted voltage level of the driving voltage when a modulation voltage is applied at a first voltage level to the modulated floating ground;
   supplying, by a circuit driving voltage supply unit, a circuit driving voltage, where the modulation voltage is applied to the circuit driving voltage supply unit;
   generating, by the circuit driving voltage supply unit, a shifted voltage level of the circuit driving voltage when the modulation voltage is applied at the first voltage level to the circuit driving voltage supply unit; and
   outputting, by an output unit, the shifted voltage level of the circuit driving voltage as an output voltage based on the shifted voltage level of the driving voltage when the modulation voltage is applied at the first voltage level.

9. The method of claim 8, where the voltage converting unit comprises a passive voltage converting element operable to convert the input voltage into the current.

10. The method of claim 9, where the passive voltage converting element is a capacitor.

11. The method of claim 8, where the voltage level shifting unit comprises a first transistor operable to drive the driving voltage based on the current.

12. The method of claim 8, where the output unit comprises a second transistor operable to drive the circuit driving voltage as the output voltage based on the driving voltage.

13. The method of claim 8, where the modulation voltage is larger than the input voltage.

14. The method of claim 8, where the output voltage is linear to the modulation voltage.

15. A system comprising:
   a voltage level shifter; and
   one or more devices coupled to an output of the voltage level shifter, where the voltage level shifter comprises:

a voltage converting unit operable to convert a first input voltage and a second input voltage into a first current and a second current, a voltage level shifting unit operable to couple to the voltage converting unit and drive a first driving voltage and a second driving voltage based on the first current and the second current from the voltage converting unit, and further operable to couple to a modulated floating ground and generate a shifted voltage level of the first driving voltage and a shifted voltage level of the second driving voltage when a modulation voltage is applied at a first voltage level to the modulated floating ground, a circuit driving voltage supply unit operable to supply a circuit driving voltage, and further operable to generate a shifted voltage level of the circuit driving voltage when the modulation voltage is applied at the first voltage level to the circuit driving voltage supply unit, and an output unit operable to couple to the voltage level shifting unit and the circuit driving voltage supply unit and supply an output voltage to the one or more devices based on the circuit driving voltage and the driving voltage, and further operable to, based on the shifted voltage level of the first driving voltage, the shifted voltage level of the second driving voltage, and the shifted voltage level of the circuit driving voltage, supply the output voltage at a second voltage level when the modulation voltage is applied at the first voltage level.

16. The system of claim 15, where the voltage converting unit comprises a passive voltage converting element operable to convert the input voltage into the current.

17. The system of claim 16, where the passive voltage converting element is a capacitor.

18. The system of claim 15, where the voltage level shifting unit comprises a first transistor operable to drive the driving voltage based on the current.

19. The system of claim 15, where the output unit comprises a second transistor operable to drive the circuit driving voltage as the output voltage based on the driving voltage.

20. The system of claim 15, where the modulation voltage is larger than the input voltage.

21. The system of claim 15, where the output voltage is linear to the modulation voltage.

* * * * *